United States Patent [19]

Yoshimoto et al.

[11] E Patent Number: Re. 33,280

[45] Reissued Date of Patent: Jul. 31, 1990

[54] SEMICONDUCTOR MEMORY DEVICE

[75] Inventors: Masahiko Yoshimoto; Tsutomu Yoshihara; Kenji Anami; Hirofumi Shinohara, all of Itami, Japan

[73] Assignee: Mitsubishi Denki Kabushiki Kaisha, Tokyo, Japan

[21] Appl. No.: 123,106

[22] Filed: Nov. 19, 1987

Related U.S. Patent Documents

Reissue of:

[64] Patent No.: 4,554,646
Issued: Nov. 19, 1985
Appl. No.: 542,388
Filed: Oct. 17, 1983

[30] Foreign Application Priority Data

Oct. 18, 1982 [JP] Japan ..... 57-184362
Oct. 20, 1982 [JP] Japan ..... 57-185817

[51] Int. Cl.[5] ..... G11C 11/40
[52] U.S. Cl. ..... 365/189.01; 365/230.03
[58] Field of Search ..... 365/189, 230, 189.01, 365/189.03, 189.04, 230.01, 230.03, 230.04, 230.05, 230.09

[56] References Cited

U.S. PATENT DOCUMENTS 3,781,828 12/1983 Platt .
4,488,266 12/1984 Spence .

FOREIGN PATENT DOCUMENTS 2001697 1/1970 Fed. Rep. of Germany .
0050022 9/1988 Fed. Rep. of Germany .

OTHER PUBLICATIONS

Intel 1103 ein dynamischer Random-Access-Speicher, pp. 20–21 (No English translation available) Von Heinz Friedberg et al.

*Primary Examiner*—Terrell W. Fears
*Attorney, Agent, or Firm*—Lowe, Price, LeBlanc, Becker & Shur

[57] ABSTRACT

A memory matrix is segmented in the direction of columns into a plurality of groups of memory cells. The memory cells are accessible through respective preceding word lines each of which is provided for each of the rows of the matrix and commonly to all of the groups of the memory cells and group word lines each of which is provided per group and per row, so that a path for column current is set up during access time only in the column which belongs to a particular group including a particular memory to be accessed.

14 Claims, 6 Drawing Sheets

SEMICONDUCTOR MEMORY DEVICE

Matter enclosed in heavy brackets [ ] appears in the original patent but forms no part of this reissue specification; matter printed in italics indicates the additions made by reissue.

BACKGROUND OF THE INVENTION

1. Field of the Invention

This invention relates to a semiconductor memory device, and more particularly to an improved semiconductor memory device which ensures improvement in access time and power consumption.

2. Description of the Prior Art

FIG. 1 is a schematic block diagram showing a conventional semiconductor memory device. Interposed between each of pairs of bit lines 2a and 2b in complementary relationship are a plurality of memory cells 1 arranged in a matrix (rows by columns). The memory cells on the same row are connected to one and the same word line 3 which enables the same. Each of the word lines 3 is connected to a row decoder 4 which in turn is connected to a row address signal line 5 for decoding row address information. Respective ones of the bit lines 2a and 2b are connected to power supply terminals 7 by way of bit line loads 6a and 6b.

FIG. 2 is a circuit diagram detailing the memory cell 1 as shown in FIG. 1. One electrode of each of access transistors 10a and 10b is connected to the bit lines 2a or 2b, respectively, while its other electrode is connected to a store node 11a or 11b of the memory cell 1, respectively, the control electrode thereof being connected to a common word line 3. There are connected between the store nodes 11a and 11b inverter transistors 9a and 9b. Furthermore, the store nodes 11a and 11b are connected to the power supply terminals 7 through load elements 8a and 8b which typically comprise resistors.

The following will set forth operation of the semiconductor memory device described above when "high" level is written into the store node 11a and "low" level into the store node 11b, for example. If it is desired to read out the subject memory cell so written, then address information for that subject cell is fed to the address signal line 5 to activate the word line 3 on the row where there is disposed the subject cell. Upon activating the word line 3 the access transistors 10a and 10b become conductive. One of the inverter transistors 9b becomes conductive or ON because of the "high" level at the store node 11a, so that current flows through the bit line load 10b, the bit line 2b, the access transistor 10b and the inverter transistor 9b from the power supply terminal 7, thereby reading out the memory cell.

Since all of the memory cells on the same row are activated within the above arrangement of the semiconductor memory device, current (column current) flows from the power supply terminal to the memory cells via the bit lines over all of the columns, consumption current is remarkable especially in case of a static RAM of a large capacity with a good number of columns. A semiconductor memory device as illustrated in FIG. 3 has been suggested as one approach to minimize consumption current. In the semiconductor memory device illustrated therein, row decoders 4 are disposed at the center of the memory cell plane with each of word lines divided into a left-sided word line 3a and a right-sided word line 3b. AND gates 12a are for selection of the left-sided word lines 3a while another AND gates 12b are for selection of the right-sided word lines 3b. One input of each of the AND gates 12a and 12b is connected to the output of each of the row decoders 4 and the other input thereof is connected to a gate signal line 13a or 13b to which a gate enable signal is fed to open the associated gates.

By selectively applying the gate enable signal via the gate signal line 13a or 13b, only the word lines associated with a selected one of the left and right groups of the memory cells are activated. Accordingly, a path for column current is set up for only half of the columns of the matrix, whereby cutdown of power consumption is assured.

FIG. 4 shows a layout of another conventional semiconductor memory device designed based upon the concept as shown in FIG. 3. Generally, row decoders 4a and 4b are disposed for a plurality of columns and word lines 3a–3d are divided correspondingly, thereby reducing the number of DC current paths.

However, this conventional semiconductor memory device requires provision of a number of the row decoders, and hence, has the problem of increased chip area and deterioration of high speed performance and yield.

SUMMARY OF THE INVENTION

This invention is directed to a semiconductor memory device including a matrix of memory cells arranged in rows and columns. The semiconductor memory device according to this invention comprises: a plurality of groups of memory cells divided by segmenting said matrix in the direction of the columns; memory cell group selection lines each provided for each of said groups for selection of any one of said plurality of the groups of said memory cells; row decoders each provided for each of said rows for decoding of row address information for a particular memory cell to be accessed; preceding word lines each connected to the output of each of said row decoders; [AND gates each provided for providing a logical product of a group enable signal carried on said memory cell group selection line and a row enable signal from said row decoders on said preceding word lines;] group word lines each provided per group and per row [for receiving the logical product output from each of said AND gates]; *and means for activating said group word lines selectively in response to a memory cell group selecting signal carried on said memory group selection line and a row enable signal from said row decoders on the preceding word line;* wherein said particular memory cell is accessed [with the logical product output from the corresponding one of said group word lines].

Accordingly, it is the primary object of the present invention to provide a semiconductor memory device which ensures high speed performance and high yield with a mininum of chip area and power consumption.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
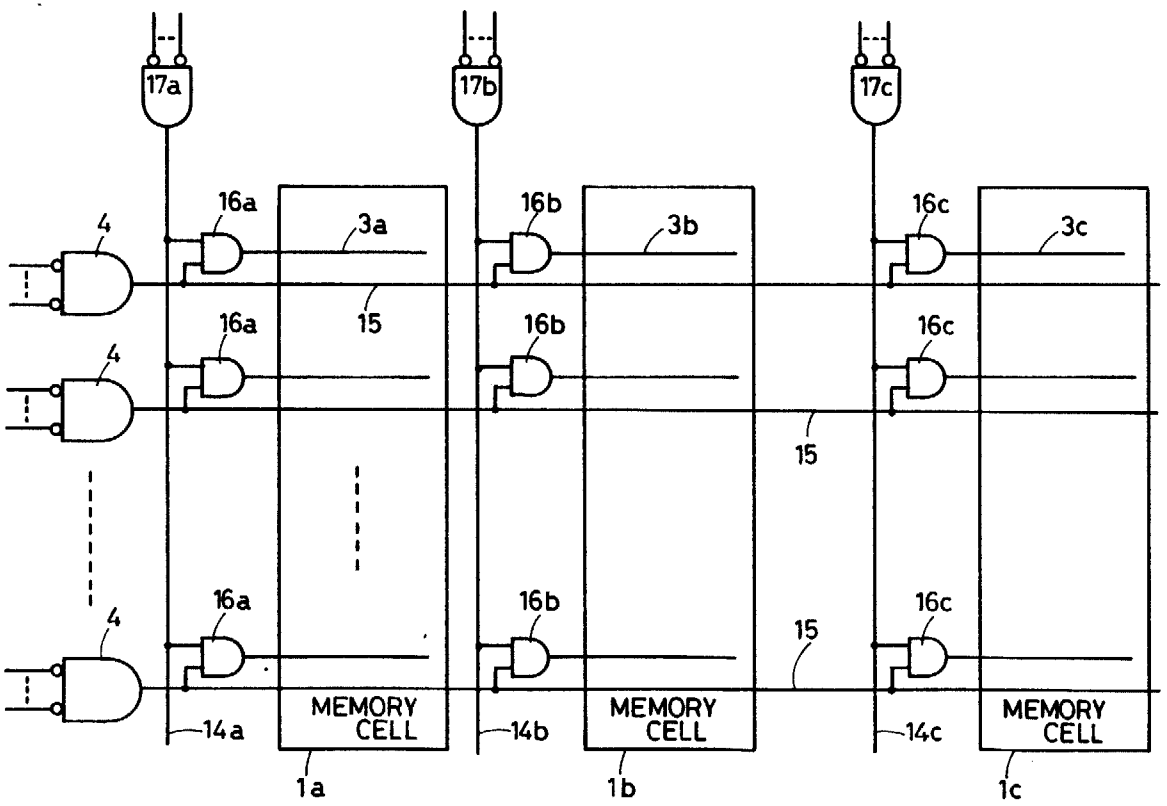
FIG. 5 is a schematic block diagram of a semiconductor memory device according to a preferred embodiment of the present invention.

FIG. 5 is a block diagram schematically showing a semiconductor memory device according to a preferred embodiment of the present invention, wherein memory cells in a matrix arrangement are divided in the direction of columns into three groups 1a, 1b and 1c, for example. Likewise with the conventional memory device, outputs of row decoders 4 are led to preceding (*e.g. input*) word lines 15 each of which is common to all of the memory cells on the same row (without regard to the groups of the memory cells). In addition to such preceding word lines 15 there are group word lines 3a, 3b and 3c which are provided for respective ones of the groups and led commonly to all of the memory cells on the same row in the same group in juxtaposition with the preceding word lines 15. One input to each of AND gates 16a, 16b and 16c for selection of the group word lines 3a, 3b and 3c is connected to corresponding one of the preceding word lines 15 common to each row and the other input thereof is connected to corresponding one of group selection lines 14a, 14b and 14c for selection of one of the groups 1a, 1b and 1c, while the output thereof is connected to each of the group word lines 3a, 3b and 3c common to each row in the same group. The group selection lines 14a, 14b and 14c are connected respectively to the outputs of memory cell group selectors 17a, 17b and 17c to which memory cell group selection signals are supplied.

Figure 2:
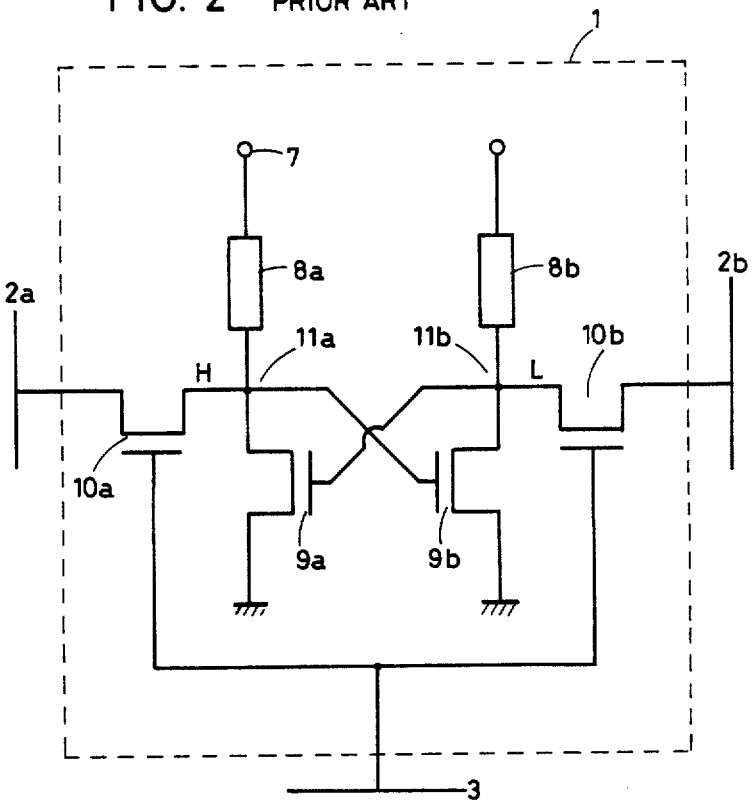
FIG. 2 PRIOR ART
FIG. 2 is a circuit diagram detailing a memory cell 1 in FIG. 1.

To reduce the area of each memory cell in the manufacture of the semiconductor memory device as discussed above, the group word lines 3a, 3b and 3c may be made up by the same layer of polysilicon as the gates of the MOS transistors 10a and 10b (see FIG. 2) and the preceding word lines 15 may be made up by a layer of polysilicon different from the above-mentioned polysilicon layer or a layer of metallic wiring typically of aluminum, molybdenum or molybdenum silicide.

Operation of the semiconductor memory device according to the preferred embodiment of the present invention as described previously will now be explained with reference to FIG. 5. The row decoders 4 decode row address information applied thereto and activate one of the preceding word lines 15 which corresponds to the row of a particular memory cell to be accessed. Assume now that the subject memory cell belongs to the first groups 1a in the first row of the memory cell matrix, for example. In this case, the highest of the preceding word lines 15 as shown in FIG. 5 (i.e. the first row) is selected and activated. The group selectors 17a, 17b and 17c decode the group selection signals applied thereto and activate one of the group selection lines 14a, 14b and 14c which corresponds to a particular group including the column of the subject memory cell to be accessed. In the given example, the subject cell is within the group 1a so that the group selection line 14a is activated. For selection of the group selection lines a suitable means other than the group selectors is also available.

Figure 1:
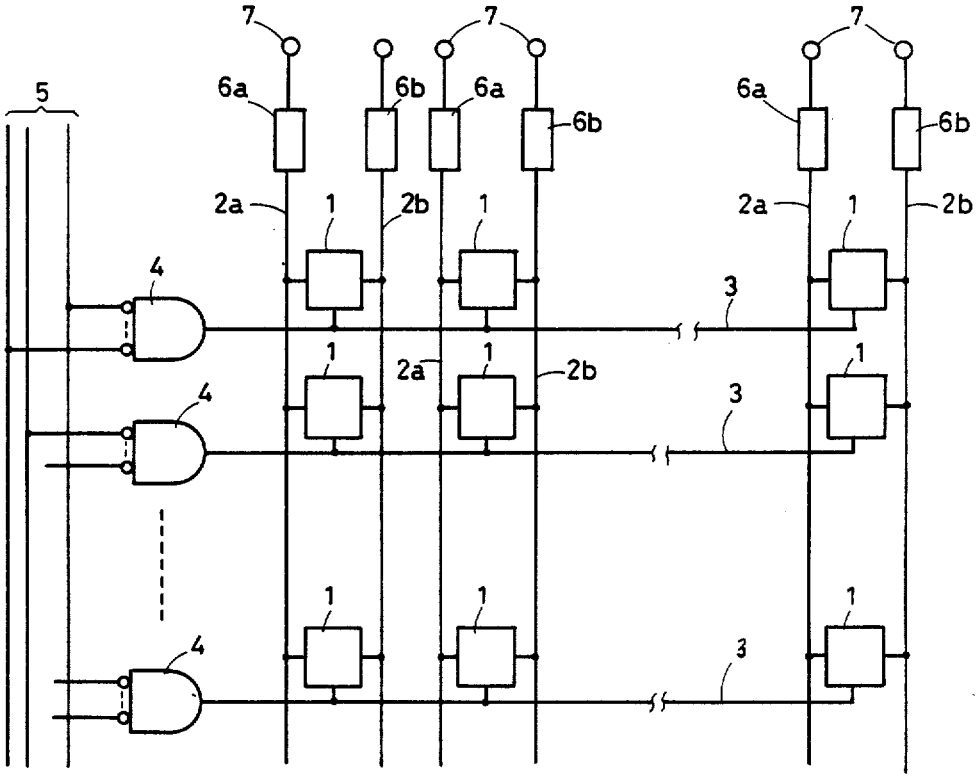
FIG. 1 PRIOR ART
FIG. 1 is a schematic block diagram showing a conventional semiconductor memory device.
Figure 4:
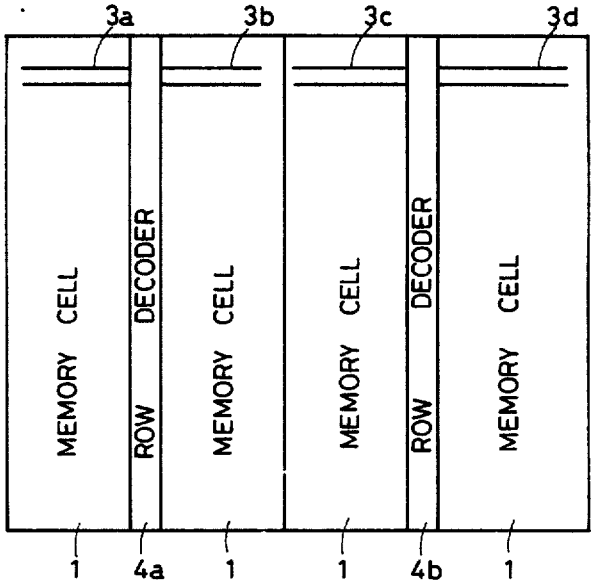
FIG. 4 PRIOR ART
FIG. 4 shows extension of the memory device of FIG. 3.

In response to concurrently activating of the preceding word line 15 and the group selection line 14a, the highest of the AND gates 16a activates the highest of the group word lines 3a which corresponds to only the first row in the group 1a. As stated previously, connected to the highest group word line 3a are only the memory cells in the group 1a on the first row of the matrix. It is thus noted that the memory cells where its associated access transistors 10a and 10b (see FIG. 2) are rendered conductive (i.e. activation of the memory cells) upon activation of the group word line 3a are only those on the first row belonging to the group 1a. Accordingly, column current, that is, current flowing from the power supply terminal 7 to the memory cells through the bit line 2b (cf. FIG. 1) is limited to only the columns including the selected group 1a of the memory cells. Eventually, this assures a substantial cutdown of consumption power.

Figure 3:
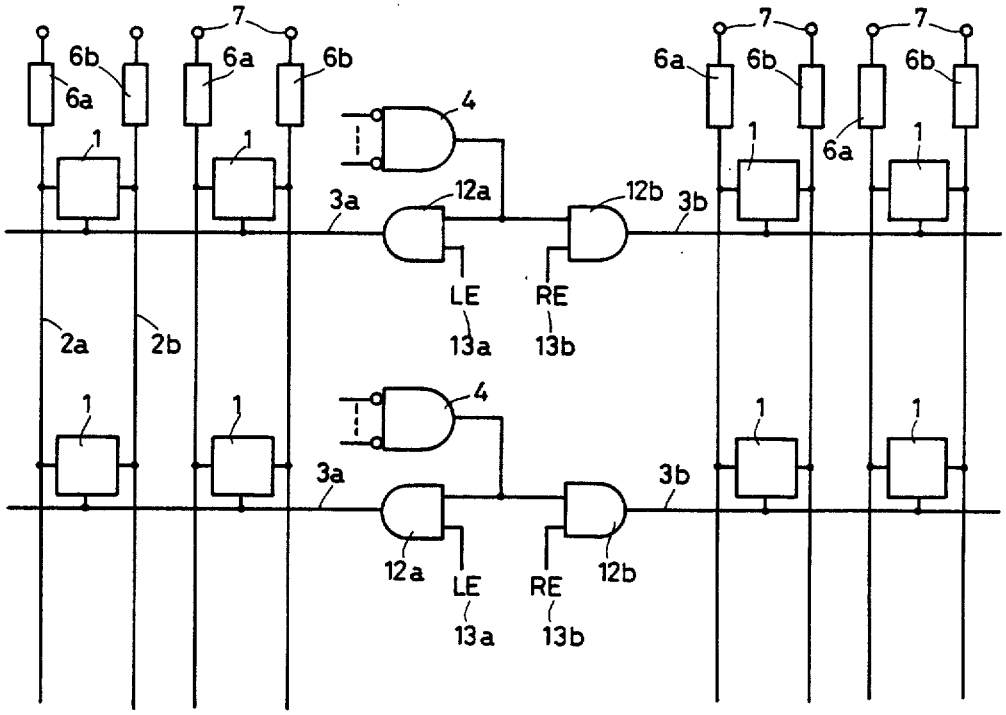
FIG. 3 PRIOR ART
FIG. 3 is a schematic block diagram showing an improved conventional semiconductor memory device.

It is possible that the above memory arrangement may be considered as similar to the conventional arrangement as shown in FIG. 3. However, the memory arrangement according to the present invention as typically shown in FIG. 5 is quite different from the conventional one of FIG. 3 and offers many advantages over the conventional one as will be clearly understood below.

In the conventional arrangement, a column of the row decoders are disposed at the center of the columns of the memory cells and all of the columns of the memory cells are divided into the right and left groups. The location of the row decoders column is limited within the columns of the memory cells and a plurality of columns of the row decoders are required when the columns of the memory cells are desired to be divided into more than two groups. Pursuant to the present invention, on the other hand, there is no limitation on the location of the row decoders column, thus assuring simple but efficient placement of the decoders especially at edge portions of memory cell regions of the chip. Furthermore, the present invention requires only one column of row decoders to divide the columns of the memory cells into an optional number of groups. Because a number of columns of the row decoders as required in the conventional memory device are not necessary, the attendant advantages are reduction of chip area, high manufacturing yield and improved high speed performance.

Figure 6:
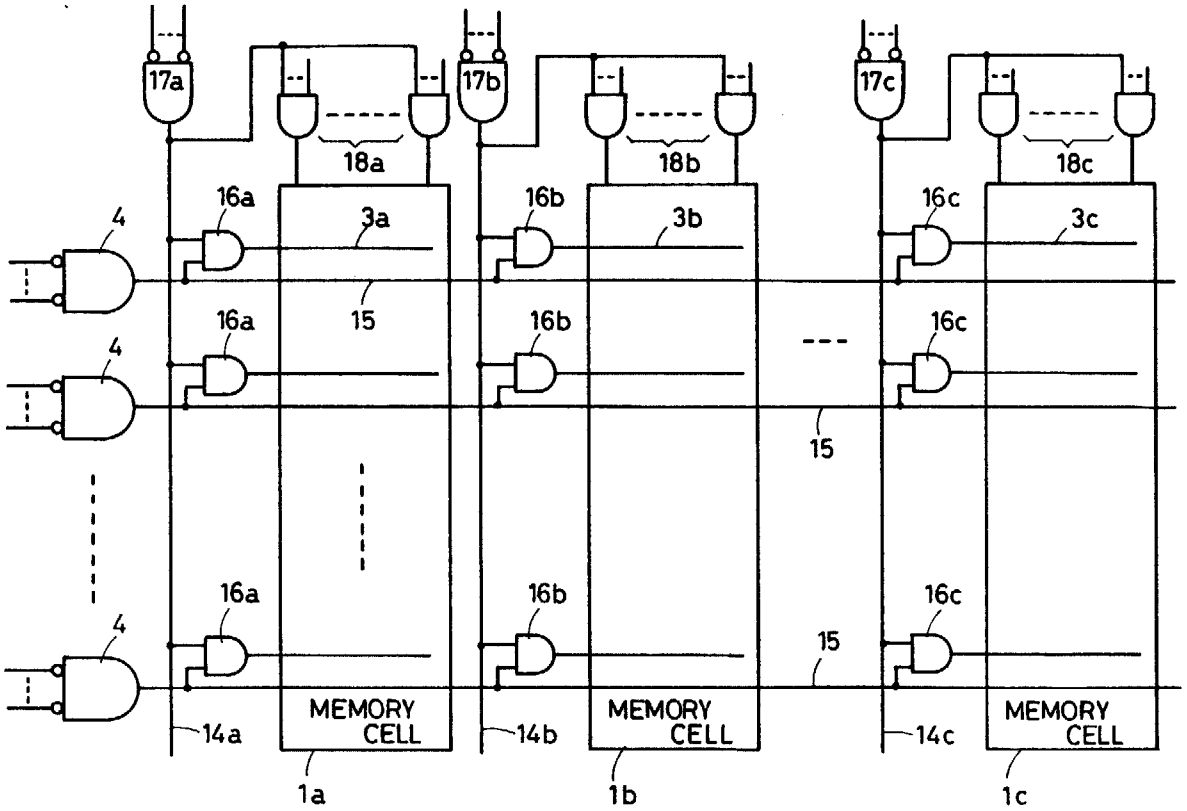
FIG. 6 is a schematic block diagram of another preferred embodiment of a semiconductor memory device according to the present invention.

The memory device according to the present invention offers not only the foregoing advantages but also further advantageous features which are not expected in the conventional device as long as it is constructed typically as shown in FIG. 6. In FIG. 6, another preferred embodiment of the semiconductor memory device according to the present invention is illustrated, which differs from the embodiment of FIG. 5 in that the outputs of the memory cell group selectors 17a, 17b and 17c are connected to not only the group selection lines 14a, 14b and 14c respectively but also column decoder groups 18a, 18b and 18c, respectively. The group selectors 17a, 17b and 17c in this embodiment serve as predecoders for column selection as well as selectors for the group selection lines as in the embodiment of FIG. 5. The column decoders 18a, 18b and 18c are greatly simplified to such as extent as to remarkable reduce layout area as compared with the column decoders in the conventional device.

Though selection of the memory cells in the memory cell group 1a has been discussed in detail, it is obvious that any memory cells in the memory cell groups 1b and 1c may be selected in the same manner. Moreover, though the memory cells are divided into the three groups in the above embodiments, they may be divided into N groups (N≧2). As long as only the preceding word lines 15 are made up by low resistance material, it is possible to access the memory cells at high speed even though the resistance of the group word lines is relatively high because the latter are short in length and small in capacitance. Furthermore, although in the above embodiments the column of the row decoders are disposed at the edge portion of the memory region in the chip, they may be disposed at the center of the memory region or any other desired location if necessary. It is further apparent that the present invention is equally applicable when the row decoders are aligned in a plurality of columns.

The AND gates 16a–16c having the two input terminals and the one output terminal are simplified in configuration and the chip area occupied by those gates is almost negligible. A preferred embodiment of the AND gates is illustrated in FIG. 7.

Figure 7:
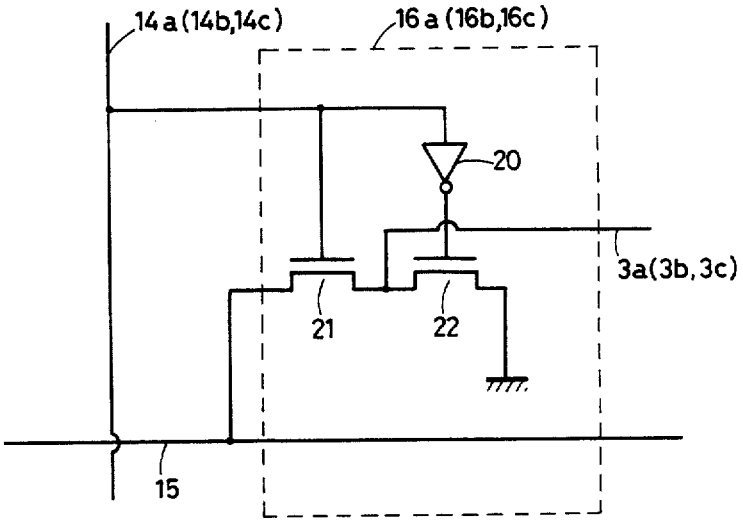
FIGS. 7 to 9 show preferred embodiments of an AND gate for use in the semiconductor memory device according to the present invention.

In FIG. 7, the drain electrode, gate electrode and source electrode of a MOS transistor 21 are respectively connected to the preceding word line 15, the memory cell group selection line 14a, 14b or 14c and the group word line 3a, 3b or 3c. The drain electrode of another MOS transistor 22 is connected to the group word line 3a, 3b or 3c with the source electrode thereof grounded. An inverter means 20 is intervened between the gate electrode of the MOS transistor 22 and the memory cell group selection line 14a, 14b or 14c.

When the memory cell group selection line 14a, 14b or 14c is disabled, the transistor 22 is ON or conductive through operation of the inverter means 20 so that the group word line 3a, 3b or 3c is grounded by way of the transistor 22. If the memory group selection line is enabled, then the transistor 22 is turned OFF and the transistor 21 is turned ON instead. If the preceding word line 15 is enabled under these circumstances, the group word line 3a, 3b or 3c is activated through the transistor 21 in ON state.

Figure 8:
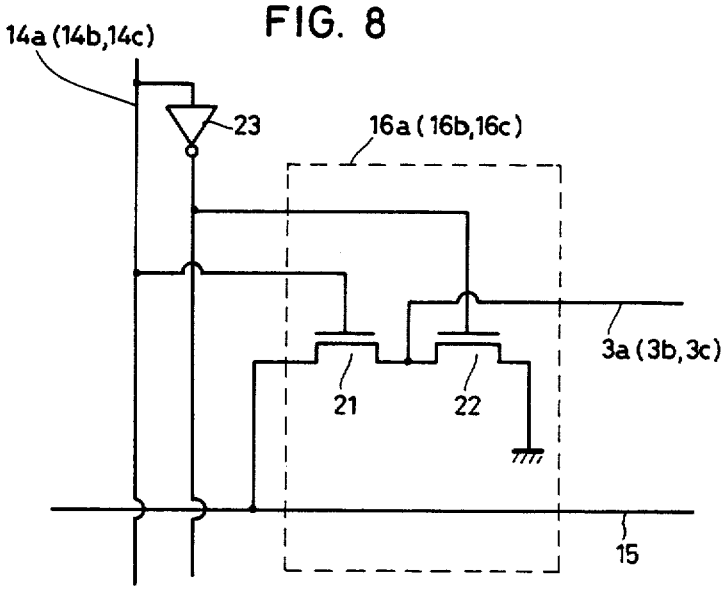

As seen in FIG. 8, the inverter 20 may be disposed out of the memory cell array and the gates of all of the MOS transistors in each of the columns may be commonly supplied with "NOT" logic output of the memory cell group selection enable signal, in which case the AND gates are simple in configuration.

Figure 9:
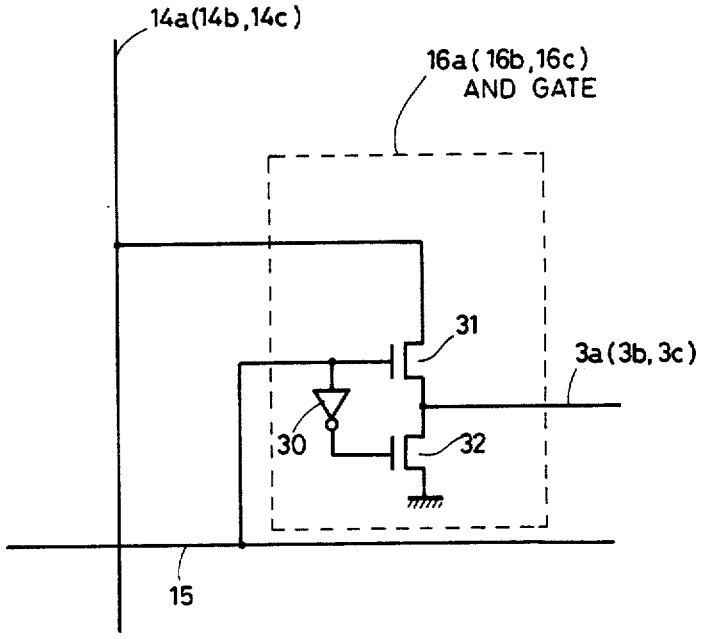

In FIG. 9, there is illustrated another preferred embodiment of the AND gates 16a, 16b and 16c. The drain electrode, gate electrode and source electrode of a MOS transistor 31 are respectively connected to the memory cell group selection line 14a, 14b or 14c, the preceding word line 15 and the group word line 3a, 3b or 3c, while the drain electrode of another MOS transistor 32 is connected to the group word line 3a, 3b or 3c and the source electrode thereof is grounded. An inverter means 30 is intervened between the gate electrodes of the two MOS transistors 31 and 32.

In the case of the AND gate as shown in FIG. 9, there is developed no parasitic gate capacitor on the preceding word line 15 because of the preceding word line 15 being isolated from the group word line 3a (3b, 3c). The preceding word line 15 may therefore be activated through the row decoder at a higher speed. In addition, the group word line 3a (3b, 3c) is activated by the memory cell group selection line 14a (14b, 14c) through the MOS transistor 31. For these reasons it is possible to access the memory cells at high speed even though the resistance of the preceding word line is relatively high. Accessing the memory cell at a higher speed is possible through using wiring material of a low resistance such as metal for the memory cell group selection lines 14a (14b, 14c) rather than the preceding word lines 15 because the load capacity of the former is greater than that of the latter. Like the AND gates in FIGS. 7 and 8 the AND gates in the last embodiment are simple in configuration with little increase in chip area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including a matrix of memory cells arranged in rows and columns, said semiconductor memory device comprising:

a plurality of groups of memory cells divided by segmenting said matrix in the direction of the columns;

memory cell group selection lines for every one of said groups for selecting any one of said plurality of the groups of said memory cells;

row decoders for every one of said rows for decoding of row address information for a particular memory cell to be accessed;

preceding word lines each connected to the output of each of said row decoders;

[AND gates each provided for providing a logical product of a group enable signal carried on said memory cell group selection line and a row enable signal from said row decoders on said preceding word lines;]

group word lines each provided per group and per row [for receiving the logical product output from each of said AND gates]; *and*

*means for selectively activating said group word lines including selector means providing a memory cell group selecting signal to at least one said memory cell group selection line and means responsive to said memory cell group selecting signal carried on said memory cell group selection line and a row enable signal from said row decoders on one of the preceding word lines for driving a selected group word line;* wherein said particular memory cell is accessed [with the logical product output from the corresponding one of said group word lines].

2. A semiconductor memory device in accordance with claim 1 [further comprising] *wherein said selector means includes* memory cell group selectors receiving and decoding memory cell group selection signals for selecting one of said plurality of the groups of the memory cells and for supplying said group enable signal output onto said selected one of said memory cell group selection lines.

3. A semiconductor memory device in accordance with claim 2 further comprising column decoders for decoding column address information for said particular memory cell to be accessed, wherein said group enable signal output on said selected one of said memory cell group selection lines is supplied to the corresponding ones of said column decoders to serve as pre-decoding means for columns selection.

4. A semiconductor memory device in accordance with claim 1 wherein said semiconductor memory device is set up on a semiconductor chip and a column of said row decoders are arranged at an edge portion of a memory region of said chip.

5. A semiconductor memory device in accordance with claim 1 wherein said semiconductor memory device is set up on a semiconductor chip and said preceding word lines are made up to relatively low resistance material.

6. A semiconductor memory device in accordance with claim 1 wherein said semiconductor memory device is set up on a semiconductor chip;

said respective memory cells include an access transistor having a control electrode connected to the corresponding one of said group word lines and made up by a layer of polysilicon;

said group word lines are formed by the same layer of polysilicon as that forming said control electrode;

said preceding word lines are made up by a layer of polysilicon different from said layer of polysilicon or a layer of metallic wiring material; and said group word lines and said preceding word lines are aligned in parallel in the direction of the rows.

7. A semiconductor memory device in accordance with claim [1] *13* wherein said AND gates each comprises:

a first input portion receiving said group enable signal from the corresponding one of said memory cell group selection lines;

a second input portion receiving said row enable signal from the corresponding one of said preceding word lines;

an output portion supplying said logical product output to the corresponding one of said group word lines;

a first transistor having a control electrode connected to said first input portion and a pair of electrodes one of which is connected to said second input portion and the other of which is connected to said output portion;

an inverter means receiving said group enable signal from said first input portion and providing its logical "NOT" output; and a second transistor having a control electrode supplied with said "NOT" output from said inverter means and a pair of electrodes one of which is connected to said output portion and the other of which is grounded.

8. A semiconductor memory device in accordance with claim [1] *13* further comprising a plurality of inverter means each provided for each of the groups for receiving said group enable signal from the corresponding memory cell group selection line and providing its logical "NOT" output; and wherein said AND gates each comprises:

a first input portion receiving said group enable signal from the corresponding one of said memory cell group selection lines;

a second input portion receiving said row enable signal from the corresponding one of said preceding word lines;

an output portion supplying said logical product output to the corresponding one of said group word lines;

a first transistor having a control electrode connected to said first input portion and a pair of electrodes one of which is connected to said second input portion and the other of which is connected to said output portion; and a second transistor having a control electrode supplied with said "NOT" output from the corresponding one of said inverter means and a pair of electrodes one of which is connected to said output portion and the other of which is grounded.

9. A semiconductor memory device in accordance with claim [1] *13* wherein said preceding word lines are isolated from said group word lines so that said preceding word lines are free of influence of a parasitic capacitor in said memory cells.

10. A semiconductor memory device in accordance with claim 9 wherein said AND gates each comprises:

a first input portion receiving said group enable signal from the corresponding one of said memory cell group selection lines;

a second input portion receiving said row enable signal from the corresponding one of said preceding word lines;

an output portion providing said logical product output to the corresponding one of said group word lines;

a first transistor having a control electrode connected to said second input portion and a pair of electrodes one of which is connected to said first input portion and the other of which is connected to said output portion;

an inverter means receiving said row enable signal from said second input portion and providing its logical "NOT" output; and a second transistor having a control electrode receiving said "NOT" output from said inverter means and a pair of electrodes one of which is connected to said output portion and the other of which is grounded.

11. A semiconductor memory device in accordance with claim 10 wherein said preceding word lines are made up by relatively low resistance material.

12. A semiconductor memory device in accordance with claim 11 wherein said material is metal.

*13. A semiconductor memory device in accordance with claim 1, wherein said activating means comprises AND gates for providing a logical product of said memory cell group selecting signal and said row enable signal.*

*14. A semiconductor memory device including a matrix of memory cells arranged in rows and columns, said semiconductor memory device comprising:*

*a plurality of groups of memory cells divided by segmenting said matrix in the direction of the columns;*

*memory cell group selection lines for every one of said groups for selecting any one of said plurality of the groups of said memory cells;*

*row decoders for every one of said rows for decoding of row address information for a particular memory cell to be accessed;*

*preceding word lines each connected to the output of each of said row decoders;*

*group word lines each provided per group and per row and*

*logic circuitry for selectively activating said group word lines including first logic circuits providing a memory*

*cell group selecting signal to ones of said memory cell selection lines and second logic circuits responsive to said memory cell group selecting signals carried on said memory cell group selection lines and to a row enable signal from said row decoders on ones of said preceding word lines for selectively driving a group word line;*

*whereby said particular memory cell is selectively accessed.*

* * * * *